(12) United States Patent
Yoon et al.

(10) Patent No.: US 11,656,962 B2
(45) Date of Patent: May 23, 2023

(54) ERASURE CODING REPAIR AVAILABILITY

(71) Applicant: NetApp, Inc., San Jose, CA (US)

(72) Inventors: Song Guen Yoon, Coquitlam (CA); Dheeraj Raghavender Sangamkar, Vancouver (CA); Emalayan Vairavanathan, Vancouver (CA)

(73) Assignee: NETAPP, INC., San Jose, CA (US)

( * ) Notice: Subject to any disclaimer, the term of this patent is extended or adjusted under 35 U.S.C. 154(b) by 0 days.

(21) Appl. No.: 17/657,786

(22) Filed: Apr. 4, 2022

(65) Prior Publication Data
US 2022/0229749 A1 Jul. 21, 2022

Related U.S. Application Data

(63) Continuation of application No. 16/711,513, filed on Dec. 12, 2019, now Pat. No. 11,372,738, which is a continuation of application No. 15/820,518, filed on Nov. 22, 2017, now Pat. No. 10,558,538.

(51) Int. Cl.
*G06F 11/20* (2006.01)
*G06F 11/10* (2006.01)
*H03M 13/15* (2006.01)
*H03M 13/37* (2006.01)

(52) U.S. Cl.
CPC ...... *G06F 11/2094* (2013.01); *G06F 11/1076* (2013.01); *G06F 11/1088* (2013.01); *H03M 13/154* (2013.01); *H03M 13/373* (2013.01); *H03M 13/3761* (2013.01); *G06F 2201/805* (2013.01); *G06F 2201/82* (2013.01)

(58) Field of Classification Search
CPC ............ G06F 11/2094; G06F 11/1076; G06F 11/1088; G06F 2201/805; G06F 2201/82; H03M 13/154; H03M 13/373; H03M 13/3761
USPC ........................................................ 714/6.24
See application file for complete search history.

(56) References Cited

U.S. PATENT DOCUMENTS

| 5,623,595 | A | 4/1997 | Bailey | |
|---|---|---|---|---|
| 6,996,766 | B2 | 2/2006 | Cypher | |
| 7,296,180 | B1 * | 11/2007 | Waterhouse | G06F 11/1662 714/2 |
| 7,681,105 | B1 | 3/2010 | Sim-Tang et al. | |
| 8,185,614 | B2 | 5/2012 | Leggette et al. | |
| 8,549,351 | B2 * | 10/2013 | Dhuse | G06F 11/1443 714/6.24 |

(Continued)

*Primary Examiner* — Yair Leibovich
(74) *Attorney, Agent, or Firm* — Haynes and Boone, LLP

(57) ABSTRACT

Distributed storage systems frequently use a centralized metadata repository that stores metadata in an eventually consistent distributed database. However, a metadata repository cannot be relied upon for determining which erasure coded fragments are lost because of a storage node(s) failures. Instead, when recovering a failed storage node, a list of missing fragments is generated based on fragments stored in storage devices of available storage nodes. A storage node performing the recovery sends a request to one or more of the available storage nodes for a fragment list. The fragment list is generated, not based on a metadata database, but on scanning storage devices for fragments related to the failed storage node. The storage node performing the recovery merges retrieved lists to create a master list indicating fragments that should be regenerated for recovery of the failed storage node(s).

20 Claims, 4 Drawing Sheets

(56) References Cited

U.S. PATENT DOCUMENTS

| | | |
|---|---|---|
| 8,621,268 B2 | 12/2013 | Dhuse |
| 8,819,516 B2 | 8/2014 | Dhuse et al. |
| 8,880,799 B2 | 11/2014 | Foster et al. |
| 8,972,684 B2 | 3/2015 | Resch et al. |
| 9,372,870 B1 | 6/2016 | Levy |
| 9,436,842 B2 | 9/2016 | Purohit |
| 9,626,245 B2 | 4/2017 | Bakre et al. |
| 9,715,505 B1 | 7/2017 | Mon |
| 9,794,366 B1 | 10/2017 | Pabon et al. |
| 10,019,192 B2 | 7/2018 | Bakre et al. |
| 10,318,198 B2 | 6/2019 | Moore |
| 10,558,538 B2 | 2/2020 | Yoon et al. |
| 10,691,366 B2 | 6/2020 | Bakre et al. |
| 2005/0066124 A1 | 3/2005 | Horn et al. |
| 2006/0053334 A1 | 3/2006 | Ingen et al. |
| 2009/0254572 A1 | 10/2009 | Redlich et al. |
| 2010/0185963 A1 | 7/2010 | Slik et al. |
| 2012/0166726 A1 | 6/2012 | De et al. |
| 2012/0290541 A1 | 11/2012 | Anderson et al. |
| 2013/0254631 A1 | 9/2013 | Luby et al. |
| 2014/0181033 A1 | 6/2014 | Pawar et al. |
| 2014/0181037 A1 | 6/2014 | Pawar et al. |
| 2014/0201162 A1 | 7/2014 | Kumarasamy et al. |
| 2015/0006846 A1 | 1/2015 | Youngworth |
| 2017/0272100 A1 | 9/2017 | Yanovsky et al. |
| 2018/0307861 A1 | 10/2018 | Johnson |

\* cited by examiner

ERASURE CODING REPAIR AVAILABILITY

CROSS-REFERENCE TO RELATED APPLICATIONS

The present application is a continuation of U.S. patent application Ser. No. 16/711,513, filed Dec. 12, 2019, which is a continuation of Ser. No. 15/820,518, filed Nov. 22, 2017 issued on Feb. 11, 2020 as U.S. Pat. No. 10,558,538, the disclosures of which are incorporated herein by reference in their entireties.

BACKGROUND

The disclosure generally relates to the field of data processing, and more particularly to data storage and recovery.

In distributed data storage systems, various methods can be used to store data in a distributed manner, e.g., to improve data availability, reliability, protection. Erasure coding is one such method of data protection in which a data object is broken into fragments, encoded with parity information, and stored across a set of storage nodes in the distributed data storage system. When a data object is erasure coded, the distributed data storage system stores the storage information in metadata. This metadata can include identities of the storage nodes that store each fragment of the encoded data object. The metadata may be maintained in a distributed database that is stored across storage nodes in the distributed data storage system.

Erasure coding involves transforming a set of k fragments of a data object into n erasure coded fragments by using the k fragments to generate m parity fragments, where n=k+m (often referred to as k+m erasure coding scheme). Some examples of k+m erasure coding scheme include 2+1, 6+3, and 8+2 erasure coding schemes. A data object can be rebuilt using a subset k of the n erasure coded fragments. If the number of available fragments is less than k, then the object cannot be recovered.

BRIEF DESCRIPTION OF THE DRAWINGS

Aspects of the disclosure may be better understood by referencing the accompanying drawings.

DESCRIPTION

Figure 1:
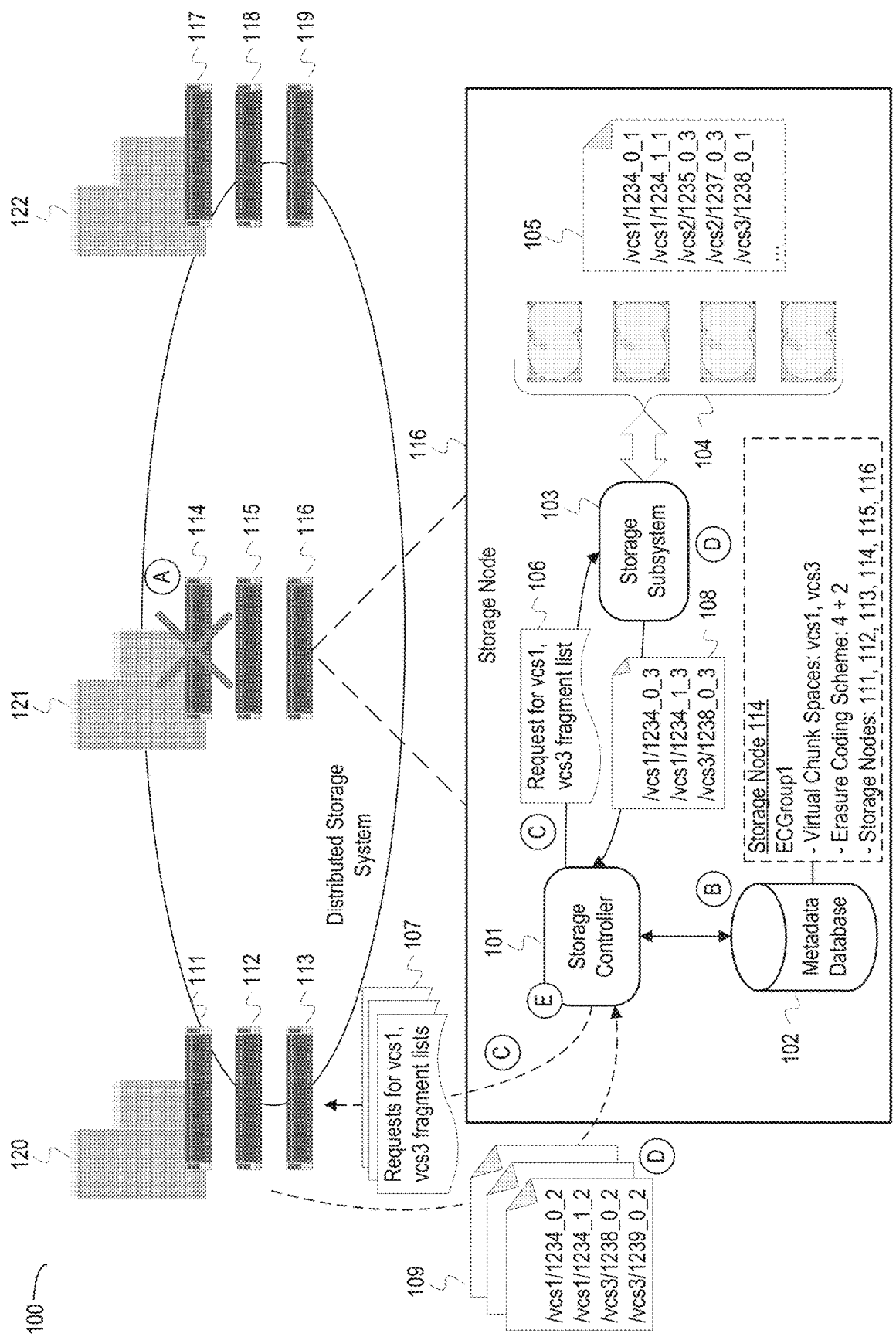
FIG. 1 is a conceptual diagram of a distributed storage system that supports reliable recovery of erasure coded data.

The description that follows includes example systems, methods, techniques, and program flows that embody aspects of the disclosure. However, it is understood that this disclosure may be practiced without these specific details. For instance, this disclosure refers to recovery of erasure coded data in illustrative examples. Aspects of this disclosure can be also applied to distributed storage systems that replicate data or utilize other data storage protection techniques. In other instances, well-known instruction instances, protocols, structures and techniques have not been shown in detail in order not to obfuscate the description.

Terminology

The description below refers to storing erasure coded data that is organized according to erasure coding groups ("ECGs") and virtual chunk spaces ("VCSs"). A VCS is a logical aggregation of storage space at a storage node. A storage node can be split into multiple VCSs and each of the VCSs can be assigned a unique ID in the distributed storage system. An ECG, or storage group, is a logical aggregation of one or more VCSs or storage space across one or more storage nodes. An ECG is associated with a specified erasure coding scheme and may have other storage restrictions, such as maximum object size, deduplication restrictions, object placement, etc. An ECG is assigned a set of VCSs across a set of storage nodes. When a data object is received for storage in the distributed storage system, a corresponding ECG is identified for the data object; the data object is erasure coded according to the scheme for the ECG; and the resulting fragments are stored in across storage nodes in a designated VCS.

Overview

Distributed storage systems frequently use a centralized metadata repository that stores metadata in an eventually consistent distributed database. Because the database is eventually consistent, failure of a storage node in the system can mean the loss of metadata which had yet to be replicated outside of the failed storage node. Additionally, executing a query on the metadata repository may require that multiple nodes be available to query against their respective copies of the metadata. If one or nodes become unavailable, metadata queries can fail and prevent recovery operations for the failed storage nodes. The risk of query failure and metadata loss is magnified in instances of multiple storage node or data center failure. As a result, the metadata repository cannot be relied upon for determining which erasure coded fragments were lost because of the storage node(s) failures. Instead, when recovering a failed storage node, a list of missing fragments is generated based on fragments stored in storage devices of available storage nodes. A storage node performing the recovery sends a request to one or more of the available storage nodes for a fragment list. The fragment list is generated, not based on a metadata database, but on scanning storage devices for fragments related to the failed storage node. The storage node performing the recovery merges retrieved lists to create a master list indicating fragments that should be regenerated for recovery of the failed storage node.

Example Illustrations

FIG. 1 is a conceptual diagram of a distributed storage system that supports reliable recovery of erasure coded data. FIG. 1 depicts a distributed storage system 100 ("system 100") that is geographically distributed across multiple sites, including sites 120, 121, and 122 which communicate via a wide area network (WAN). Each of the sites houses multiple of the storage nodes 111-119. A storage node is a collection of processes (application processes, services, etc.) that store object data and metadata on storage devices and access object data and metadata on storage devices. The collection of processes can be encapsulated by a virtual machine and/or a physical host machine. FIG. 1 depicts a conceptual diagram of a storage node 116. The node 116 includes a storage controller 101 ("controller 101"), a metadata database 102, a storage subsystem 103, and storage devices 104 with a file system 105. The storage devices 104 can include a number of hard disks, random access memory, flash storage arrays, magnetic tape storage, etc. Each of the nodes 111-119 may be similar to the node 116.

Storage nodes 111-119 at any of the sites 120-122 can ingest objects into the system 100. Ingest refers to the operations by one or more storage nodes to store an object in the system 100 according to a client request and any governing storage policies or schemes. The ingest process includes assigning an object identifier to an object based on an object namespace defined for the system 100. Ingest also includes erasure coding an object based on an erasure coding scheme for a corresponding ECG and storing the resulting fragments across one or more of the nodes 111-119 in the system 100. The object identifier and ECG identifier are recorded in a distributed metadata database for the system 100. Each of the nodes 111-119 includes a metadata database, such as the metadata database 102, that is part of an overall distributed metadata database for the system 100. The distributed metadata database is an eventually consistent database, meaning that changes to the database at one node in the system 100 are eventually synchronized with metadata databases at other nodes.

At stage A, the node 114 fails, and the node 116 initiates a recovery process after detecting failure of the node 114. The node 114 may fail due to failed storage devices, corrupt data, loss of network connection, etc. The node 116 can detect that the node 114 has failed based on the node 114 not responding to requests, or the failure of the node 114 may be indicated to the node 116 by an administrator through a management interface for the system 100. FIG. 1 depicts the node 116 as managing the recovery process; however, each of the nodes in the system 100 may be capable of detecting the failure of the node 114 and performing the recovery process. In some implementations, the recovery process may be performed by whichever node is currently acting as a manager or leader for a cluster of nodes. For example, if node 115 is the leader for the cluster of nodes 114-116, the node 115 may perform the recovery process. In instances where an entire site, such as the site 121, is taken offline, a node from another site, such as the site 120 or 122, may perform the recovery process.

At stage B, the controller 101 of the node 116 identifies ECGs affected by the failure of the node 114. Affected ECGs are those who have data stored on the node 114. Recovery of the node 114 is performed per affected ECG since the recovery process for each ECG will utilize different VCSs, erasure coding schemes, and storage nodes depending on the current ECG being recovered. The controller 101 queries the metadata database 102 to identify ECGs that utilize the node 114 for storage of erasure coded fragments. Also, for each affected ECG, the controller 101 determines the VCSs assigned to the ECG, the erasure coding scheme, and the utilized storage nodes. Some or all of this information may be contained in another location besides the metadata database 102. For example, the erasure coding scheme utilized for the ECG or assigned storage nodes may be stored in memory or in a configuration file for the ECG. In FIG. 1, the controller 101 determines from the metadata database 102 that the ECG "ECGroup1" has been affected by the failure of the node 114. Additionally, the controller 101 determines that the VCSs "vcs1" and "vcs3" and nodes 111-116 are assigned to the "ECGroup1" and that the "ECGroup1" utilizes a 4+2 erasure coding scheme.

After identifying affected ECGs, the controller 101 may determine whether each ECG can be recovered. Since each ECG uses a k+m erasure coding scheme, the ECG can be recovered if at least k storage nodes are still available. The controller 101 may iteratively verify that each ECG has the requisite number of nodes available and remove ECGs without the requisite number of nodes from a list of ECGs to be recovered. Recovery of the ECGs without the requisite number of nodes may be later retried by the controller 101 automatically or after a manual instruction by an administrator. For the "ECGroup1" with a 4+2 scheme, the controller 101 verifies that at least four nodes of the assigned nodes 111-116 are available, which is the case in FIG. 1.

At stage C, the controller 101 sends a request 106 for a list of fragments in VCSs assigned to the "ECGroup1" from the storage subsystem 103. The storage subsystem 103 manages the underlying file system and storage of fragments on the storage devices 104. As shown in the depiction of the file system 105, the storage subsystem 103 may organize fragments on the storage devices 104 into directories according to a designated VCS. For example, the "vcs1" directory in the file system 105 includes the fragments with identifiers "1234_0_1" and "1234_1_1."

Also, at stage C, the controller 101 sends requests 107 for fragment lists from other storage nodes in the "ECGroup1." While the controller 101 may recover an ECG based on a fragment list from a single node, a master list of missing fragments is more reliable if generated based on fragment lists merged from multiple nodes. For instance, a node may have missing fragments due to data corruption, write failures, disk failures, etc., so a fragment list from that node may not list all fragments that need to be restored. Merging fragment lists from multiple nodes reduces the chance that a fragment will be missed during recovery. Therefore, the controller 101 sends the requests 107 for fragment lists to the nodes 111-113. In some implementations, the controller 101 may be configured to obtain fragment lists from at least k nodes, where k corresponds to the erasure coding scheme for an ECG (e.g., k=4 for the "ECGroup1"). Additionally, if more than the minimum number of nodes are available, the controller 101 may send requests to all available nodes. Also, the controller 101 may prioritize which nodes receive requests based on their network or geographic proximity to the node 116. For example, the node 115 may be prioritized based on being at the same site 121 as the node 116, which would reduce overall network traffic between sites. Nodes may be prioritized based on other factors such as available network bandwidth, current processor load, storage requests load, etc.

At stage D, the storage subsystem 103 generates a list of fragments 108 which indicates fragments in the requested VCSs. The storage subsystem 103 performs operations to scan the file system 105 on the storage devices 104 for the fragments in the requested VCSs. In FIG. 1, the fragments are organized into directories which correspond to each VCS, so the controller 101 scans the directories corresponding to the requested VCSs, "vcs1" and "vcs3." In some implementations, the file system 105 may not support directories, and instead, a VCS may be indicated in a fragment identifier for each stored fragment, such as "vcs1_1234_0_1." In such implementations, the storage subsystem 103 analyzes the fragment identifiers to identify those in the requested VCSs. In other implementations, fragments may be stored in a database as opposed to a file system, and the controller 101 or the storage subsystem 103 may perform queries against the database to identify related fragments. The storage subsystem 103 adds the identified fragments to the fragment list 108 and supplies the list 108 to the controller 101. Also, at stage D, the nodes 111-113 return their lists of fragments 109 to the controller 101. Storage subsystems on the nodes 111-113 perform similar operations as the storage subsystem 103 described above to generate the lists of fragment identifiers 109.

At stage E, the controller 101 merges the list of fragments 108, 109 to generate a master list of fragments to be restored for the node 114. In FIG. 1, a fragment identifier consists of three parts: (1) an object identifier, (2) a stripe number, and (3) a fragment number. For example, for the fragment identifier "1234_0_1," the "1234" is an object identifier corresponding to the object from which the fragment was generated via erasure coding; the "0" is the stripe number; and the "1" is the fragment number. If two fragments from the same object are stored on the same VCS, the fragment identifier for the second fragment will have an incremented stripe number. For example, the fragment identifier "1234_1_1" has a stripe number of 1, and the other fragment identifier corresponding to the object 1234, "1234_0_1," has a stripe number of 0. The controller 101 identifies each unique pair of object identifier and stripe number in the fragment identifiers to generate the master list of fragments to be recovered for the ECG. The object identifiers in the master list indicate which object data should be used to generate the missing fragments, and the stripe numbers control the number of fragments to be generated from the object.

The controller 101 may merge the four lists 108, 109 using a variety of merging algorithms. The controller 101 may first combine the lists and create a new list sorted based on object identifier. The controller 101 may then begin removing any entries with a duplicate object identifier and stripe number pair. In some implementations, the controller 101 may parse the fragment identifiers to extract the object identifier and stripe number pairs prior to sorting and deduplicating the combined list. The master list generated by the controller 101 in FIG. 1 would include the following object identifier and stripe number pairs: 1234_0, 1234_1, 1238_0, and 1239_0. The controller 101 may use a variety of data structures for merging, sorting, and listing the fragments, such as a linked list, array, table, graph, tree etc.

When merging the lists, the controller 101 can record fragments which appear to be missing from one or more storage nodes which supplied the fragment lists 108, 109. For example, in FIG. 1, the fragment lists 109 include a fragment "1239_0_2" in "vcs3" which was not included in the fragment list 108 from the storage node 116. The controller 101 may supply the object identifier "1239" to a fragment recovery service for the storage node 116 so that a fragment for the data object "1239" can be generated and restored to the storage node 116.

After creating the master list, the controller 101 may begin recovering the failed node 114 or may supply the master list to another node or service for regenerating the lost fragments. For example, the controller 101 may iteratively invoke a function or application programming interface (API) for a service in the system 100 using the object identifiers in the master list to generate the necessary fragments. The process of restoring a fragment can differ based on an erasure coding algorithm used. For example, in some instances, an object may first be reconstructed so that the reconstructed object can be processed using the erasure coding algorithm to generate another fragment. In some instances, the erasure coding algorithm can generate additional fragments based on existing fragments and not require reconstruction of the object. Once a missing fragment is generated, the fragment is stored on the recovered node 114 or another node designated as a replacement for the node 114.

The controller 101 may persist the generated master list in the storage devices 104 or other persistent storage. The master list may be labeled as corresponding to one or more ECGs or storage nodes. If those ECGs or storage nodes are again being recovered, the controller 101 uses the persisted master list as a starting point for recovery. Additionally, the persisted master list may be timestamped and used as a checkpoint for indicating which fragments were stored on the storage nodes at that point in time.

In order to reduce an in-memory footprint, each of the nodes 111, 112, 113, and 116 may only stream a portion of the fragment identifiers at a time. Since a VCS may store up to 1,000,000 fragments, sending all fragment identifiers at once may be prohibitively resource intensive. As a result, the controller 101 may request a subset of fragment identifiers, e.g. 1,000, at a time. After processing the subset, the controller 101 may request another subset until all fragment identifiers in the identified VCSs have been analyzed and merged into a master list as described at stage E.

FIG. 1 depicts a single ECG as being affected by the node 114 to avoid obfuscating the illustration. Generally, a storage node failure will affect multiple ECGs. The controller 101 can iteratively perform the operations described above to recover each ECG. In some instances, the node 116 may not be part of or assigned to an ECG to be recovered. In such instances, the node 116 can still perform the recovery by requesting fragment lists from nodes in the ECG or may transmit a request to a node in the ECG to perform recovery of the ECG.

Figure 2:
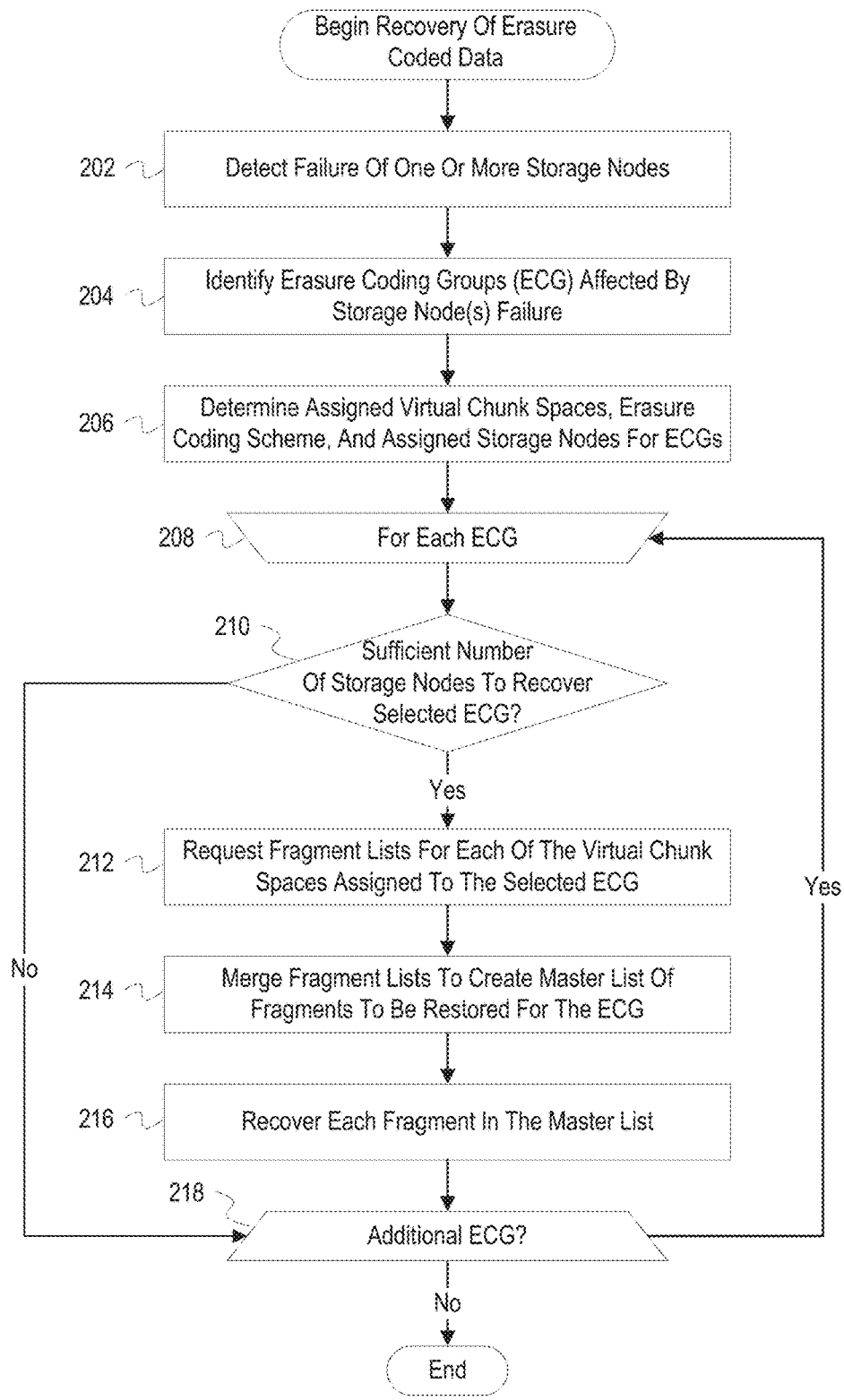
FIG. 2 depicts a flowchart with example operations for recovering erasure coded data.

FIG. 2 depicts a flowchart with example operations for recovering erasure coded data. FIG. 2 describes a storage node as performing the operations although naming of devices and program code can vary among implementations.

A storage node ("node") detects the failure of one or more storage nodes in a distributed storage system (202). The node may detect the failure of other storage nodes in a variety of ways including determining that the storage nodes are non-responsive, receiving a notification from a network monitoring agent, etc. The node may be a manager of a cluster of storage nodes and may use a heartbeat system with periodic requests to determine whether storage nodes are still active. In some implementations, the node receives instructions from a management application indicating that one or more nodes have failed and need to be recovered.

The node identifies ECGs affected by the storage node(s) failure (204). The node may query a metadata database using identifiers for the failed storage nodes to retrieve a list of the affected ECGs. While the metadata database may be unreliable for obtaining fragment listings, ECG and VCS information do not change as frequently as fragments, so the metadata database is likely a reliable source for this information. Alternatively, an administrator through a management application may supply the node with a list of affected ECGs.

The node determines assigned VCSs, erasure coding schemes, and assigned storage nodes for each of the ECGs (206). The node may obtain this information by querying the metadata database or may obtain this information from a configuration file for the ECG.

The node begins recovering erasure coded data for each of the ECGs (208). The node iterates through the ECGs to be recovered to identify and recover missing fragments. The node may begin with affected ECGs that have been flagged as critical or may sort the ECGs for recovery based on the amount of data stored in each ECG, the number of VCSs assigned to each ECG, etc. The ECG currently being recovered is hereinafter referred to as "the selected ECG."

The node determines whether there is a sufficient number of storage nodes available to recover the selected ECG (210). If there is an insufficient number of storage nodes available, the missing fragments for the selected ECG cannot currently be recovered. The node may mark the selected ECG to be recovered later, or the node may mark the ECG as lost if recovery of the ECG has been attempted a specified number of times or if storage nodes in the ECG are determined to be permanently unavailable. The node can infer the number of storage nodes needed based on the erasure coding scheme and number of storage nodes assigned to the selected ECG. For a k+m erasure coding scheme, k fragments are needed to reconstruct a data object and regenerate missing fragments. If fragments are stored in a 1 fragment to 1 storage node ratio, then k number of storage nodes are needed to recover erasure coded data. In some instances, each node may contain two or more fragments, requiring less storage nodes to be available. The node can infer the number of fragments stored per node based on the number of storage nodes assigned to an ECG and the erasure coding scheme. If 6 storage nodes are assigned to an ECG with a 4+2 erasure coding scheme, the node can infer that fragments are stored at a 1:1 ratio. If 3 storage nodes are assigned to an ECG with a 4+2 erasure coding scheme, the node can infer that fragments are stored at a 2 fragments to 1 storage node ratio so only 2 nodes are required for recovery. The node can determine whether the sufficient number of storage nodes are available by pinging the storage nodes assigned to the selected ECG or querying a manager application for the status of the storage nodes.

If there is a sufficient number of storage nodes, the node requests fragment lists for each of the VCSs assigned to the selected ECG (212). The node submits requests to one or more of the available storage nodes assigned to the selected ECG. The storage nodes generate the fragment lists by scanning their storage devices for fragments stored in the identified VCSs. The storage nodes add fragment identifiers for each of the fragments to the fragment list and return the fragment list to the requesting node. When multiple VCSs assigned to an ECG are being recovered, the node may recover them sequentially or in parallel. Also, as described in more detail in FIG. 3, the node may incrementally collect the fragment lists by requesting a portion of the fragment lists from the storage nodes at a time. Furthermore, the node can vary the number of fragment lists requested from storage nodes based on a number of available storage nodes, an erasure coding scheme utilized by the selected ECG, a target recovery time, available bandwidth, etc. For example, if speed is prioritized over accuracy when recovering missing fragments, the node may request a fragment list from a single node or rely on its owned stored fragments, if possible. Additionally, the node may prioritize which storage nodes of available storage nodes receive requests based on proximity to the storage nodes and available resources of the storage nodes.

The node merges the fragment lists to create a master list of fragments to be restored for the selected ECG (214). The master list indicates which data objects had fragments stored on the failed storage node(s) and how many fragments were stored on each node. The node analyzes the retrieved fragment lists to identify unique object identifier and stripe number pairs. Alternatively, the node may identify unique object identifiers and determine the largest stripe number associated with each object identifier. If multiple fragments for a same object are stored on a storage node, the stripe number is incremented for each fragment. So, based on the largest stripe number, the node can infer how many fragments for an object are stored on each node. For example, a stripe number of 3 indicates that four fragments (belonging to stripe numbers 0, 1, 2, and 3, respectively) should be generated from the associated object data and stored on a storage node being recovered.

The node recovers fragments in the master list for the selected ECG (216). Using the object identifiers in the master list and the ECG information, the node (or another recovery service) retrieves corresponding fragments from available nodes to generate missing fragments through erasure coding. The number of fragments retrieved is based on the erasure coding scheme for the selected ECG. For example, for a 5+4 erasure coding scheme, any of the 5 available fragments of a stripe are retrieved. The number of missing fragments generated is based on the number of unique object identifier and stripe number pairs for a given object identifier in the master list or on the largest stripe number associated with an object identifier as described above. The same master list can be used to recover missing fragments for each failed storage node in the selected ECG. The missing fragments may be stored on the same failed storage node after repair or on another storage node designated as a replacement. In instances where an entire site has failed, the recovered fragments may be temporarily stored on nodes in another site and replicated to the failed site upon repair.

After recovery of the selected ECG or after determining that the selected ECG cannot be recovered, the node determines whether there is an additional ECG (218). If there is an additional affected ECG, the node selects the next ECG for recovery. If there are no additional ECGs to be recovered, the process ends.

Figure 3:
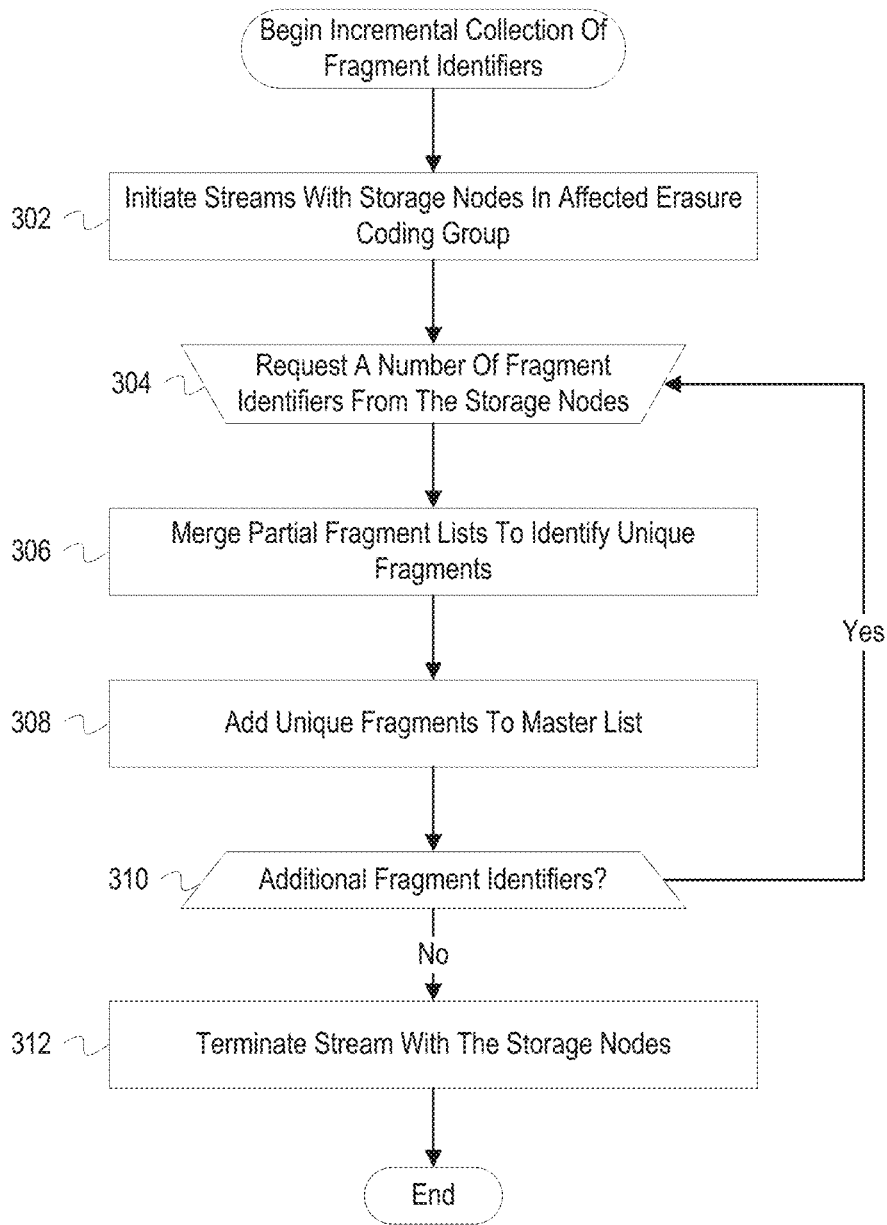
FIG. 3 depicts a flowchart with example operations for incrementally collecting fragment identifiers.

FIG. 3 depicts a flowchart with example operations for recovering incrementally collecting fragment identifiers. FIG. 3 describes a storage node as performing the operations although naming of devices and program code can vary among implementations. FIG. 3 describes an alternate implementation for performing blocks 212 and 214 of FIG. 2.

A storage node ("node") initiates streams with storage nodes assigned to an affected ECG (302). After failure of a storage node, the node identifies an affected ECG and determines storage nodes assigned to the ECG. The node then selects one or more of the storage nodes from which to request a list of fragment identifiers. To begin collecting the fragment lists, the node initiates a stream or opens a connection with each of the selected storage nodes to be used for incrementally streaming fragment identifiers. The node may initiate a stream by retrieving connection information for the storage nodes (e.g. Internet Protocol addresses, port numbers) and submitting a request to connect to the storage nodes. If storage nodes are located at a different site, the node may initiate a secure shell (SSH) connection or authenticate with a virtual private network (VPN) associated with a local area network of the site. In some implementations, the node may utilize an API of the other storage nodes to invoke a service for identifying and sending fragment identifiers.

The node requests a number of fragment identifiers from the storage nodes (304). The node submits a request through the stream established with the storage nodes. The number of fragment identifiers requested can vary based on available resources of the node or the storage nodes receiving the requests. For example, if the node has sufficient memory space, the node may increase the number of fragment identifiers requested. Conversely, if the node is low on a resource, such as bandwidth, the node may decrease the number of fragment identifiers requested. The storage nodes which receive the requests scan their storage devices for fragments related to the request (e.g. fragments in a VCS indicated in the request). The storage nodes then stream the requested number of fragment identifiers to the node. The storage nodes may be configured to stream the fragment identifiers in alphabetical or numerical order.

The node merges partial fragment lists to identify unique fragments (306). As the node receives the streams of fragment identifiers, the node adds the fragment identifiers to lists in memory, each list corresponding to one of the storage nodes. The node then merges the partial lists as described above in FIGS. 1 and 2 to remove duplicate fragment identifiers (i.e. identifiers for fragments corresponding to a same data object).

The node adds the unique fragments to a master list (308). The node may maintain a master list of fragment identifiers in memory to which additional batches of unique fragment identifiers are added. Alternatively, the node may maintain the master list in a file system on other storage media (e.g., hard disk, flash array), especially when operating in an environment with limited memory resources.

The node determines whether there are additional fragment identifiers (310). The node submits another request for fragment identifiers to the storage nodes. If additional fragment identifiers are received, the node continues processing the identifiers. If no additional fragment identifiers are received, the node determines that there are no more fragment identifiers.

If there are no more fragment identifiers, the node terminates the streams with the storage nodes. The node may terminate the stream by terminating any SSH connections which were opened or relinquishing ports used for the stream. If an API service was invoked, the service may automatically terminate the connection once the end of the fragment identifiers is reached. After the stream is terminated, the process ends.

Variations

FIG. 1 is annotated with a series of letters A-E. These letters represent stages of operations. Although these stages are ordered for this example, the stages illustrate one example to aid in understanding this disclosure and should not be used to limit the claims. Subject matter falling within the scope of the claims can vary with respect to the order and some of the operations.

The flowcharts are provided to aid in understanding the illustrations and are not to be used to limit scope of the claims. The flowcharts depict example operations that can vary within the scope of the claims. Additional operations may be performed; fewer operations may be performed; the operations may be performed in parallel; and the operations may be performed in a different order. For example, the operations depicted in blocks 306 and 308 of FIG. 3 can be performed in parallel or concurrently. With respect to FIG. 2, the operations of block 202 may not be performed by a storage node as a recovery process may be manually initiated. It will be understood that each block of the flowchart illustrations and/or block diagrams, and combinations of blocks in the flowchart illustrations and/or block diagrams, can be implemented by program code. The program code may be provided to a processor of a general purpose computer, special purpose computer, or other programmable machine or apparatus.

The examples often refer to a "node." The node is a construct used to refer to implementation of functionality for managing data storage in a distributed storage system. This construct is utilized since numerous implementations are possible. A node may be a particular component or components of a machine (e.g., a particular circuit card enclosed in a housing with other circuit cards/boards), machine-executable program or programs (e.g., file systems, operating systems), firmware, a circuit card with circuitry configured and programmed with firmware for managing data storage, etc. The term is used to efficiently explain content of the disclosure. The node can also be referred to as storage controller, a storage manager, a file server. Although the examples refer to operations being performed by a node, different entities can perform different operations. For instance, a dedicated co-processor or application specific integrated circuit can identify missing fragments or perform fragment recovery.

As will be appreciated, aspects of the disclosure may be embodied as a system, method or program code/instructions stored in one or more machine-readable media. Accordingly, aspects may take the form of hardware, software (including firmware, resident software, micro-code, etc.), or a combination of software and hardware aspects that may all generally be referred to herein as a "circuit," "module" or "system." The functionality presented as individual modules/units in the example illustrations can be organized differently in accordance with any one of platform (operating system and/or hardware), application ecosystem, interfaces, programmer preferences, programming language, administrator preferences, etc.

Any combination of one or more machine readable medium(s) may be utilized. The machine readable medium may be a machine readable signal medium or a machine readable storage medium. A machine readable storage medium may be, for example, but not limited to, a system, apparatus, or device, that employs any one of or combination of electronic, magnetic, optical, electromagnetic, infrared, or semiconductor technology to store program code. More specific examples (a non-exhaustive list) of the machine readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a machine readable storage medium may be any tangible medium that can contain, or store a program for use by or in connection with an instruction execution system, apparatus, or device. A machine readable storage medium is not a machine readable signal medium.

A machine readable signal medium may include a propagated data signal with machine readable program code embodied therein, for example, in baseband or as part of a carrier wave. Such a propagated signal may take any of a variety of forms, including, but not limited to, electromagnetic, optical, or any suitable combination thereof. A machine readable signal medium may be any machine readable medium that is not a machine readable storage medium and that can communicate, propagate, or transport a program for use by or in connection with an instruction execution system, apparatus, or device.

Program code embodied on a machine readable medium may be transmitted using any appropriate medium, including but not limited to wireless, wireline, optical fiber cable, RF, etc., or any suitable combination of the foregoing.

Computer program code for carrying out operations for aspects of the disclosure may be written in any combination of one or more programming languages, including an object oriented programming language such as the Java® programming language, C++ or the like; a dynamic programming language such as Python; a scripting language such as Perl programming language or PowerShell script language; and conventional procedural programming languages, such as the "C" programming language or similar programming languages. The program code may execute entirely on a stand-alone machine, may execute in a distributed manner across multiple machines, and may execute on one machine while providing results and or accepting input on another machine.

The program code/instructions may also be stored in a machine readable medium that can direct a machine to function in a particular manner, such that the instructions stored in the machine readable medium produce an article of manufacture including instructions which implement the function/act specified in the flowchart and/or block diagram block or blocks.

Figure 4:
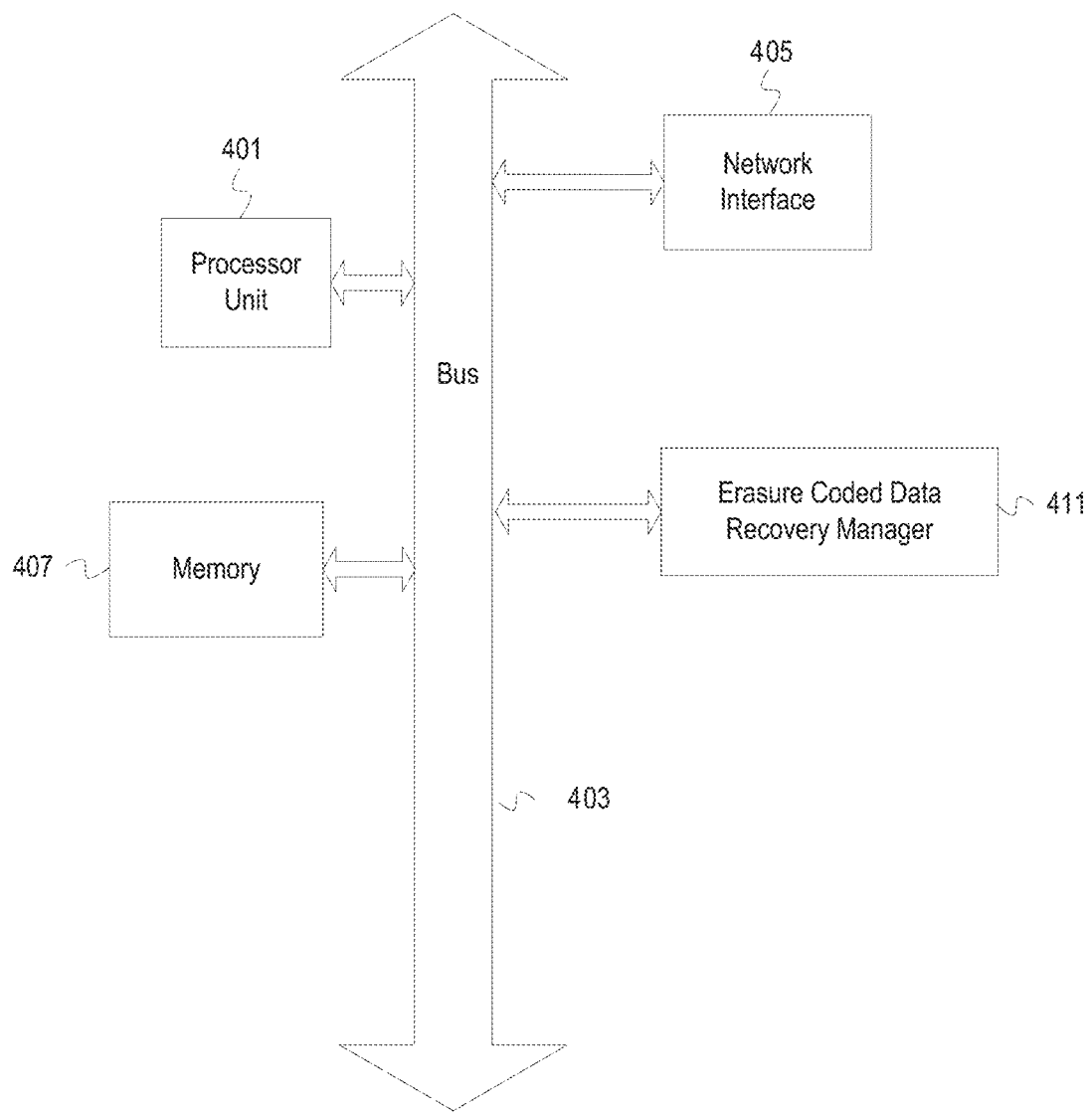
FIG. 4 depicts an example computer system with an erasure coded data recovery manager.

FIG. 4 depicts an example computer system with an erasure coded data recovery manager. The computer system includes a processor unit 401 (possibly including multiple processors, multiple cores, multiple nodes, and/or implementing multi-threading, etc.). The computer system includes memory 407. The memory 407 may be system memory (e.g., one or more of cache, SRAM, DRAM, zero capacitor RAM, Twin Transistor RAM, eDRAM, EDO RAM, DDR RAM, EEPROM, NRAM, RRAM, SONOS, PRAM, etc.) or any one or more of the above already described possible realizations of machine-readable media. The computer system also includes a bus 403 (e.g., PCI, ISA, PCI-Express, HyperTransport® bus, InfiniBand® bus, NuBus, etc.) and a network interface 405 (e.g., a Fiber Channel interface, an Ethernet interface, an internet small computer system interface, SONET interface, wireless interface, etc.). The system also includes an erasure coded data recovery manager 411. The erasure coded data recovery manager 411 allows for high availability recovery of erasure coded data by identifying and recovering missing fragments without relying on a centralized metadata system. Any one of the previously described functionalities may be partially (or entirely) implemented in hardware and/or on the processor unit 401. For example, the functionality may be implemented with an application specific integrated circuit, in logic implemented in the processor unit 401, in a co-processor on a peripheral device or card, etc. Further, realizations may include fewer or additional components not illustrated in FIG. 4 (e.g., video cards, audio cards, additional network interfaces, peripheral devices, etc.). The processor unit 401 and the network interface 405 are coupled to the bus 403. Although illustrated as being coupled to the bus 403, the memory 407 may be coupled to the processor unit 401.

While the aspects of the disclosure are described with reference to various implementations and exploitations, it will be understood that these aspects are illustrative and that the scope of the claims is not limited to them. In general, techniques for identifying and recovering missing erasure coded fragments as described herein may be implemented with facilities consistent with any hardware system or hardware systems. Many variations, modifications, additions, and improvements are possible.

Plural instances may be provided for components, operations or structures described herein as a single instance. Finally, boundaries between various components, operations and data stores are somewhat arbitrary, and particular operations are illustrated in the context of specific illustrative configurations. Other allocations of functionality are envisioned and may fall within the scope of the disclosure. In general, structures and functionality presented as separate components in the example configurations may be implemented as a combined structure or component. Similarly, structures and functionality presented as a single component may be implemented as separate components. These and other variations, modifications, additions, and improvements may fall within the scope of the disclosure.

Use of the phrase "at least one of" preceding a list with the conjunction "and" should not be treated as an exclusive list and should not be construed as a list of categories with one item from each category, unless specifically stated otherwise. A clause that recites "at least one of A, B, and C" can be infringed with only one of the listed items, multiple of the listed items, and one or more of the items in the list and another item not listed.

What is claimed is:

1. A method performed in a distributed storage system having a plurality of storage nodes, the method being performed by a first storage node of the plurality of storage nodes, the method comprising:
   identifying a subset of the plurality of storage nodes that are affected by unavailability of a second storage node of the plurality of storage nodes;
   requesting fragment lists from the subset of the plurality of storage nodes, wherein each fragment list identifies at least one erasure coded object fragment stored on a respective node of the subset of the plurality of storage nodes;
   merging received fragment lists, including identify unique object identifiers across the received fragment lists, and removing from the received fragment lists a plurality of erasure coded object fragments having duplicate unique object identifiers;
   identifying, from the received fragment lists, a first erasure coded object fragment affected by the unavailability of the second storage node of the plurality of storage nodes; and
   restoring the first erasure coded object fragment.

2. The method of claim 1, wherein restoring the first erasure coded object fragment comprises:
   reconstructing a first object and processing the first object using an erasure coding scheme associated with the first erasure coded object fragment to generate a second erasure coded object fragment.

3. The method of claim 1, wherein identifying a subset of the plurality of storage nodes is performed in response to manually detecting failure of the second storage node.

4. The method of claim 1, wherein requesting the fragment lists comprises requesting a number of fragment identifiers from a third storage node and a fourth storage node, the method further comprising: identifying unique fragments from received fragment identifiers.

5. The method of claim 1, wherein requesting the fragment lists comprises:
   requesting fragment lists from a minimum number of storage nodes according to an erasure coding scheme associated with the first erasure coded object fragment.

6. The method of claim 1, wherein identifying a first erasure coded object fragment comprises:
   determining, from the received fragment lists, a number of erasure coded object fragments corresponding to unique object identifiers and which are stored on a single storage node.

7. The method of claim 1, wherein requesting the fragment lists comprises:
   prioritizing requesting fragment lists from ones of the plurality of storage nodes having locations that are closer to the first storage node.

8. The method of claim 1 further comprising generating, by a third storage node of the subset of the plurality of storage nodes, a first fragment list, including scanning a directory of a file system on the third storage node.

9. The method of claim 1, wherein requesting fragment lists comprises streaming partial fragment lists from the subset of the plurality of storage nodes.

10. A non-transitory machine-readable medium having stored thereon machine executable code which, when executed by a first storage node of a plurality of storage nodes, causes the first storage node to:
identify a second storage node and a third storage node of the plurality of storage nodes that are affected by unavailability of a fourth storage node of the plurality of storage nodes;
request a first fragment list from the second storage node, wherein the first fragment list identifies a first plurality of erasure coded object fragments stored on the second storage node;
request a second fragment list from the third storage node, wherein the second fragment list identifies a second plurality of erasure coded object fragments stored on the third storage node;
identify unique object identifiers across the first fragment list and the second fragment list;
generate a merged fragment list from the first fragment list and the second fragment list, including removing from the first fragment list a plurality of erasure coded object fragments having duplicate unique object identifiers;
identify, from the merged fragment list, a first erasure coded object fragment affected by the unavailability of the fourth storage node; and
restore the first erasure coded object fragment.

11. The machine-readable medium of claim 10, further comprising code to cause the first storage node to determine an erasure coding scheme utilized by the first erasure coded object fragment.

12. The machine-readable medium of claim 11, further comprising code to cause the first storage node to:
determine a minimum number of storage nodes from which to request fragment lists based, at least in part, on the erasure coding scheme; and
request fragment lists from no more than the minimum number of storage nodes.

13. The machine-readable medium of claim 10, wherein the code to cause the first storage node to request the first fragment list comprises code to cause the first storage node to stream a partial fragment list from second storage node.

14. The machine-readable medium of claim 10, further comprising code to cause the first storage node to:
scan a directory of a file system on the first storage node to create a third fragment list from the first storage node.

15. The machine-readable medium of claim 10, wherein identifying the second storage node and the third storage node is performed in response to detecting failure of the fourth storage node.

16. A first storage node of a plurality of storage nodes, comprising:
a memory containing machine readable medium comprising machine executable code having stored thereon instructions for performing a method of erasure coding repair;
a processor coupled to the memory, the processor configured to execute the machine executable code to cause the processor to:
identify a subset of the plurality of storage nodes that are affected by unavailability of a second storage node of the plurality of storage nodes;
request fragment lists from the subset of the plurality of storage nodes, wherein each fragment list identifies at least one erasure coded object fragment stored on a respective node of the subset of the plurality of storage nodes;
merge received fragment lists, including identify unique object identifiers across the received fragment lists, and removing from the received fragment lists a plurality of erasure coded object fragments having duplicate unique object identifiers;
identify, from the received fragment lists, a first erasure coded object fragment affected by the unavailability of the second storage node of the plurality of storage nodes; and
restore the first erasure coded object fragment.

17. The first storage node of claim 16, wherein requesting fragment lists comprises streaming partial fragment lists from the subset of the plurality of storage nodes.

18. The first storage node of claim 16, further comprising machine executable code to cause the processor to:
based on a determination that there is at least a minimum number of storage nodes available among the plurality of storage nodes, request fragment lists from the subset of the plurality of storage nodes equal to the minimum number of storage nodes.

19. The first storage node of claim 16, wherein the machine executable code to cause the processor to request the fragment lists comprises code to cause the processor to:
prioritize requests for fragment lists from ones of the plurality of storage nodes having locations that are closer to the first storage node.

20. The first storage node of claim 16, further comprising machine executable code to cause the processor to generate a first fragment list by scanning a directory of a file system on the first storage node.

* * * * *